US009047935B2

(12) United States Patent
Chen et al.

(10) Patent No.: US 9,047,935 B2
(45) Date of Patent: Jun. 2, 2015

(54) READ TIMING GENERATION CIRCUIT

(75) Inventors: Weiwei Chen, Beijing (CN); Lan Chen, Beijing (CN); Shiyang Yang, Beijing (CN)

(73) Assignee: Institute of Microelectronics, Chinese Academy of Sciences, Beijing (CN)

(*) Notice: Subject to any disclaimer, the term of this patent is extended or adjusted under 35 U.S.C. 154(b) by 0 days.

(21) Appl. No.: 14/123,104

(22) PCT Filed: Nov. 25, 2011

(86) PCT No.: PCT/CN2011/082926
§ 371 (c)(1),
(2), (4) Date: Nov. 28, 2013

(87) PCT Pub. No.: WO2013/075326
PCT Pub. Date: May 30, 2013

(65) Prior Publication Data
US 2014/0092697 A1 Apr. 3, 2014

(51) Int. Cl.
*G11C 7/00* (2006.01)
*G11C 7/22* (2006.01)
*G11C 8/18* (2006.01)
*G11C 8/06* (2006.01)
*G11C 7/12* (2006.01)

(52) U.S. Cl.
CPC *G11C 7/222* (2013.01); *G11C 8/06* (2013.01); *G11C 8/18* (2013.01); *G11C 7/12* (2013.01)

(58) Field of Classification Search
CPC .................................. G11C 7/12; G11C 7/10
USPC ............................................ 365/203, 189.05
See application file for complete search history.

(56) References Cited

U.S. PATENT DOCUMENTS

| 4,843,596 A | 6/1989 | Miyatake |
| 6,348,822 B1 | 2/2002 | Morikawa |
| 6,700,828 B2 | 3/2004 | Mizugaki |
| 6,903,983 B2 * | 6/2005 | Hara et al. ............... 365/189.04 |
| 2003/0081487 A1 | 5/2003 | Mizugaki |

FOREIGN PATENT DOCUMENTS

| CN | 1414562 A | 4/2003 |
| CN | 102426851 A | 4/2012 |

OTHER PUBLICATIONS

PCT International Search Report issued in PCT/CN2011/082926.
PCT Written Opinion issued in PCT/CN2011/082926.

* cited by examiner

*Primary Examiner* — Michael Tran
(74) *Attorney, Agent, or Firm* — Goodwin Procter LLP

(57) ABSTRACT

Disclosed is a read timing generation circuit, capable of reducing dynamic power consumption. After a multi-bit address Add1, Add2, . . . , and AddN passes through an address change monitoring unit (100), a response pulse signal corresponding the address is generated. After the response pulse signal passes through an address trigger determination unit (200), a single trigger determination signal ATDPRE is generated. The single trigger determination signal ATDPRE passes through an ATD timing generation unit (300) and a post-timing generation unit (1000), thereby forming a read timing generation circuit in a serial link and generating corresponding read timing. Compared with the conventional read timing generation circuit in which each bit of an address signal corresponds to a stage of structures to execute the trigger, ATD control timing output, and ATD determination process separately, the present invention greatly reduces the total dynamic power consumption of the circuit.

8 Claims, 3 Drawing Sheets

READ TIMING GENERATION CIRCUIT

CROSS-REFERENCE OF RELATED APPLICATION(S)

This application is a U.S. national stage application of, and claims priority to, International Application No. PCT/CN2011/082926, filed Nov. 25, 2011, which is incorporated by reference herein in its entirety.

FIELD OF THE INVENTION

The present invention generally relates to the field of design of memory circuits, and more specifically to a read timing generation circuit.

BACKGROUND OF THE INVENTION

With the popularization of portable personal devices, there has been an increasing need for memories, and memory technologies have become an important subject in information technology studies.

Read timing generation circuits are widely applied in the design of memories. A read timing generation circuit generates, in response to the input of a multi-bit address signal, read timing related control signals such as Address Transition Detection (ATD), Sense Amplification Precharge Control (SAPC), Sense Out LATch (SOLAT) and Sense Enable (SEN).

In a conventional multi-stage read timing generation circuit, the first stage has a parallel structure. As shown in FIG. 1, the first stage of a read timing generation circuit includes an address transition detection unit 10, an ATD timing generation unit 20 and an ATD decision unit 30. For each bit of an address signal, there is a corresponding stage which independently performs triggering, ATD control timing outputting and ATD decision. That is, the bits of an address signal are entered in parallel into the address transition detection unit 10, the outputs of the address transition detection unit 10 are entered in parallel into the ATD timing generation unit 20, and the outputs of the ATD timing generation unit 20 are entered in parallel into the ATD decision unit 30.

However, the read timing generation circuit has a problem that, with increasing storage capacity and number of bits in an address, since each bit corresponds to a stage, the parallel structure will cause significant increase in the dynamic power consumption of the read timing generation circuit.

SUMMARY OF THE INVENTION

An embodiment of the present invention provides a read timing generation circuit with reduced dynamic power consumption.

In order to achieve the object above, an embodiment of the present invention provides the following technical solution.

A read timing generation circuit, includes: an address transition detection unit, an address triggering and decision unit, an ATD timing generation unit and a following-stage timing generation unit, wherein the address transition detection unit has input terminals receiving in parallel a plurality of bits of an address, and is adapted to generate a corresponding set of response pulses;

the address triggering and decision unit has input terminals connected in parallel to output terminals of the address transition detection unit, and is adapted to generate a single trigger and decision signal;

the ATD timing generation unit has an input terminal receiving the trigger and decision signal, and is adapted to generate an address transition detection signal; and the following-stage timing generation unit has an input terminal receiving the address transition detection signal, and is adapted to generate subsequent control signals.

Optionally, the following-stage timing generation unit includes: a read precharge unit, a sense amplification delay unit, a data latch delay unit and a data output parallel delay unit; the subsequent control signals include: Sense Amplification Precharge Control (SAPC), Sense Out LATch (SOLAT) and Sense Enable (SEN); and the read precharge unit has an input terminal receiving the address transition detection signal, and is adapted to generate SAPC;

the sense amplification delay unit has an input terminal receiving SAPC and an output terminal connected to an input terminal of the data latch delay unit;

the data latch delay unit is adapted to generate SOLAT; and the data output parallel delay unit has an input terminal receiving SOLAT and another input terminal receiving SAPC, and is adapted to generate SEN.

Optionally, the address transition detection unit includes a plurality of address transition detection branches, each of which includes a first NOT gate, a second NOT gate and a first XNOR gate; and in each of the address transition detection branches, an input terminal of the first NOT gate receives one of the plurality of bits of the address, an output terminal of the first NOT gate is connected to an input terminal of the first XNOR gate via the second NOT gate; the other input terminal of the first XNOR gate is connected to the bit of the address; and an output terminal of the first XNOR gate outputs a response pulse corresponding to the bit of the address.

Optionally, the address triggering and decision unit includes a first AND gate; and an input terminal of the first AND gate is connected to an output terminal of the address transition detection unit, and an output terminal of the first AND gate outputs the single trigger and decision signal.

Optionally, the ATD timing generation unit includes a third NOT gate, a first capacitor and a second AND gate; and an input terminal of the third NOT gate receives the trigger and decision signal, an output terminal of the third NOT gate is connected to both the first capacitor and an input terminal of the second AND gate, the other input terminal of the second AND gate receives the trigger and decision signal, and an output terminal of the second AND gate outputs the address transition detection signal.

Optionally, the read precharge unit includes a fourth NOT gate, a second capacitor and a third AND gate; and an input terminal of the fourth NOT gate receives the address transition detection signal, an output terminal of the fourth NOT gate is connected to both the second capacitor and an input terminal of the third AND gate, the other input terminal of the third AND gate receives the address transition detection signal, and an output terminal of the third AND gate outputs SAPC.

Optionally, the sense amplification delay unit includes a fifth NOT gate, a sixth NOT gate, a third capacitor and a first OR gate; and an input terminal of the fifth NOT gate receives SAPC, an output terminal the fifth NOT gate is connected to both the third capacitor and an input terminal of the first OR gate via the sixth NOT gate, and the other input terminal of the first OR gate is connected to an output terminal of the fifth NOT gate.

Optionally, the data latch delay unit includes a seventh NOT gate, an eighth NOT gate, a ninth NOT gate, a tenth NOT gate, a fourth capacitor and a fourth AND gate; and an input terminal of the seventh NOT gate is connected to an output terminal of the sense amplification delay unit, an output terminal of the seventh NOT gate is connected to both the fourth capacitor and an input terminal of the ninth NOT gate via the eighth NOT gate, an output terminal of the ninth NOT gate is connected to an input terminal of the fourth AND gate via the tenth NOT gate, the other input terminal of the fourth AND gate is connected to an output terminal of the seventh NOT gate, and an output terminal of the fourth AND gate outputs SOLAT.

Optionally, the data output parallel delay unit includes an eleventh NOT gate, a twelfth NOT gate, a thirteenth NOT gate, a second OR gate and a fifth capacitor; and an input terminal of the eleventh NOT gate receives SOLAT, an output terminal of the eleventh NOT gate is connected to both the fifth capacitor and the thirteenth NOT gate via the twelfth NOT gate, an output terminal of the thirteenth NOT gate is connected to an input terminal of the second OR gate, the other input terminal of the second OR gate receives SAPC, and an output terminal of the second OR gate outputs SEN.

In comparison with the prior art, the technical solution above has the following advantages.

In the read timing generation circuit according to an embodiment of the present invention, a single trigger and decision signal is generated by the address triggering and decision unit. Then through the ATD timing generation unit and the following-stage timing generation unit, which form a serial link in the read timing generation circuit, a corresponding read timing is generated from the trigger and decision signal. As opposed to the conventional read timing generation circuit where for each bit of an address signal there is a corresponding stage which independently performs triggering, ATD control timing outputting and ATD decision, the read timing generation circuit according to an embodiment of the present invention has reduced overall dynamic power consumption, which is even more significant when the number of bits in an address is large.

BRIEF DESCRIPTION OF THE DRAWINGS

The above and other objects, features and advantages of the present invention will become more apparent when read in conjunction with the accompanying drawings. In the accompanying drawings, the same reference numerals denote the same components. The accompanying drawings may not be drawn to scale, in order not to unnecessarily obscure the present invention.

DETAILED DESCRIPTION OF EMBODIMENTS

The above objects, features and advantages of the present invention will become more apparent from the following description of the embodiments of the present invention.

Specific details are given below to provide a thorough understanding of the present invention. Those skilled in the art will understand, however, that the present invention may be practiced without one or more of the specific details, or with other methods. Hence, the present invention is not limited to the specific implementations described herein.

Figure 1:
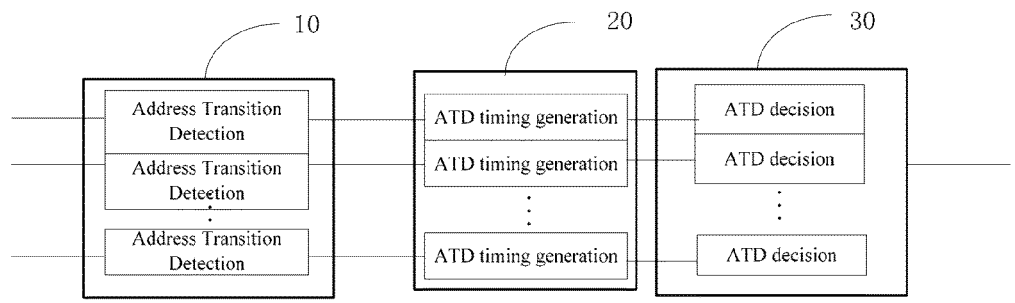
FIG. 1 is a structural diagram illustrating a read timing generation circuit in the prior art.
Figure 2:
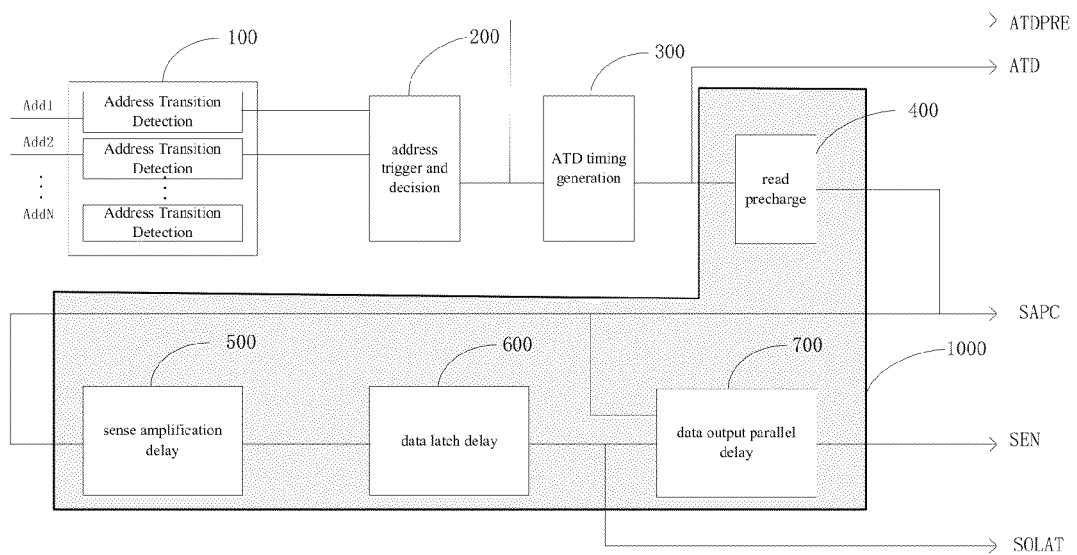
FIG. 2 is a structural diagram illustrating a read timing generation circuit according to an embodiment of the present invention.

As shown in FIG. 2, a structural diagram illustrating a read timing generation circuit according to an embodiment of the present invention, the read timing generation circuit includes: an address transition detection unit 100, an address triggering and decision unit 200, an ATD timing generation unit 300 and a following-stage timing generation unit 1000.

The address transition detection unit 100 has input terminals receiving in parallel a plurality bits of an address, Add1, Add2 . . . AddN, and is adapted to generate a corresponding set of response pulses.

The address triggering and decision unit 200 has input terminals connected in parallel to output terminals of the address transition detection unit 100, and is adapted to generate a single trigger and decision signal, ATDPRE.

The ATD timing generation unit 300 has an input terminal receiving the trigger and decision signal ATDPRE, and is adapted to generate an address transition detection signal, ATD.

The following-stage timing generation unit 1000 has an input terminal receiving the address transition detection signal ATD, and is adapted to generate subsequent control signals.

The address transition detection unit 100 outputs a set of response pulses each of which corresponds to one of the plurality of bits of the address. The response pulses are entered in parallel to the input terminals of the address triggering and decision unit 200, which generates a single trigger and decision signal ATDPRE after logical operations. Therefore, the high power consumption in the prior art due to the use of a parallel structure for ATD timing outputting is avoided.

In the read timing generation circuit according to an embodiment of the present invention, response pulse signals corresponding to a multi-bit address Add1, Add2 . . . AddN are generated by the address transition detection unit 100, and a single trigger and decision signal ATDPRE is generated by the address triggering and decision unit 200. Then through the ATD timing generation unit and the following-stage timing generation unit, which form a serial link in the read timing generation circuit, a corresponding read timing is generated from the trigger and decision signal ATDPRE. As opposed to the conventional read timing generation circuit where for each bit of an address signal there is a corresponding stage which independently performs triggering, ATD control timing outputting and ATD decision, the read timing generation circuit according to an embodiment of the present invention has reduced overall dynamic power consumption, which is even more significant when the number of bits in an address is large.

The following-stage timing generation unit 1000 can be designed according to specific needs. In an embodiment of the present invention, the following-stage timing generation unit 1000 includes a read precharge unit 400, a sense amplification delay unit 500, a data latch delay unit 600 and a data output parallel delay unit 700. And the subsequent control signals include Sense Amplification Precharge Control (SAPC), Sense Out LATch (SOLAT) and Sense Enable (SEN).

The read precharge unit 400 has an input terminal receiving the address transition detection signal ATD, and is adapted to generate SAPC.

An input terminal of the sense amplification delay unit 500 receives SAPC, an output terminal of the sense amplification delay unit 500 is connected to an input terminal of the data latch delay unit 600. The data latch delay unit 600 is adapted to generate SOLAT.

The sense amplification delay unit 500 is for providing processing time for sense amplification of the memory chip.

The data output parallel delay unit 700 has an input terminal receiving SOLAT and another input terminal receiving SAPC, and is adapted to generate SEN.

In the read timing generation circuit above, after the trigger and decision signal ATDPRE is generated, a series of read timing signals including ATD, SAPC, SOLAT and SEN are generated by a serial link. The circuit has relatively low dynamic power consumption and ensures tight timing of the output signals.

For a better understanding of the present invention, a specific embodiment and output waveforms will be described in detail hereinafter.

Figure 3:
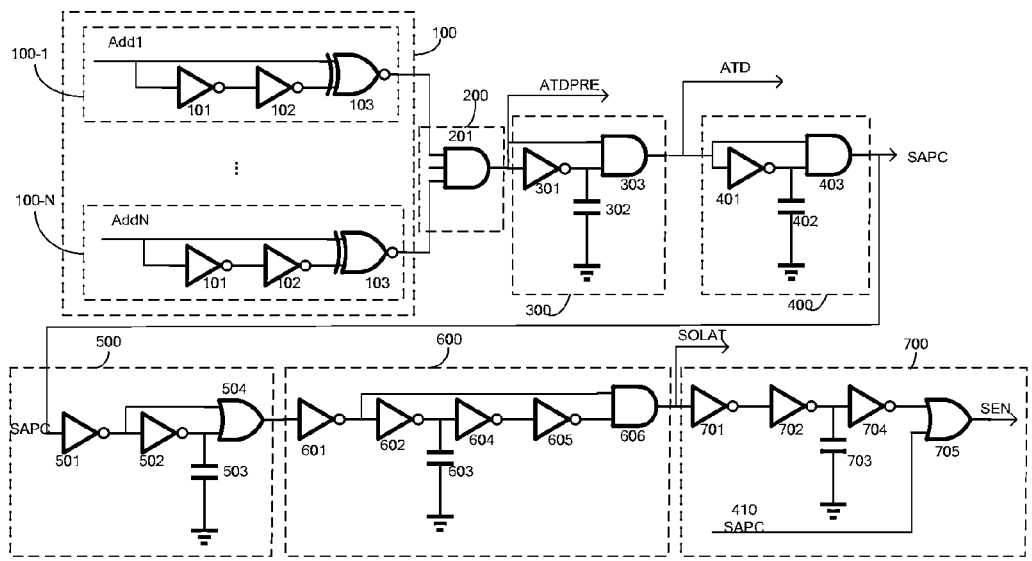
FIG. 3 is a structural diagram illustrating a read timing generation circuit according to an embodiment of the present invention.
Figure 4:
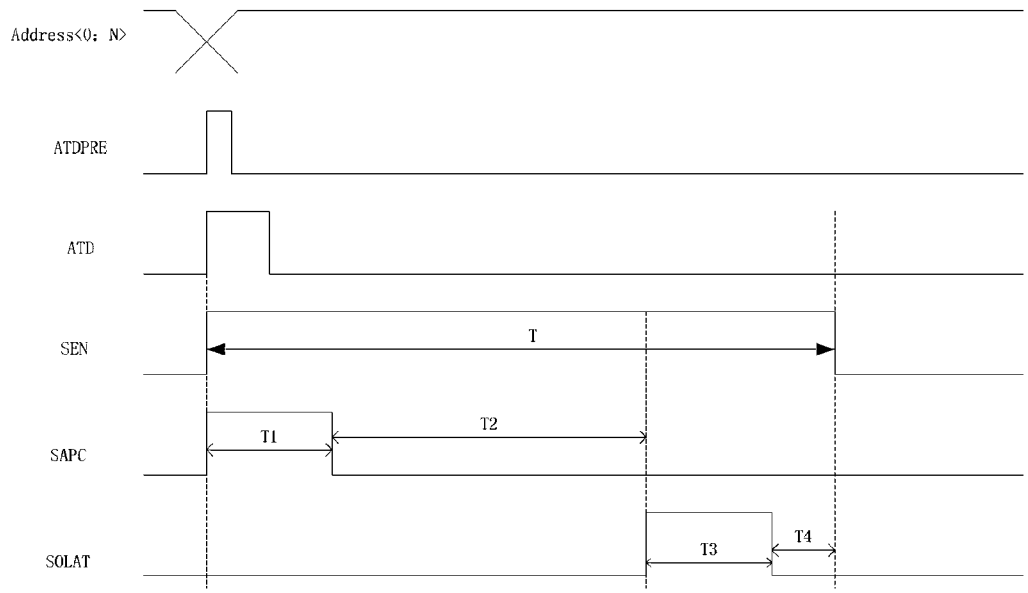
FIG. 4 illustrates waveforms at main nodes in a read timing generation circuit according to an embodiment of the present invention.

Reference is made to FIG. 3 and FIG. 4. FIG. 3 is a structural diagram illustrating a read timing generation circuit according to an embodiment of the present invention. FIG. 4 illustrates waveforms at main nodes in the read timing generation circuit according to an embodiment of the present invention.

In the embodiment, the address transition detection unit 100 includes a plurality of address transition detection branches, 100-1 . . . 100-N, each address transition detection branch 100-1 or 100-N includes a first NOT gate 101, a second NOT gate 102 and a first XNOR gate 103. In each of the address transition detection branches, for example, in the first address transition detection branch 100-1 which receives the first bit of an address, an input terminal of the first NOT gate 101 receives a bit Add1, an output terminal of the first NOT gate 101 is connected to an input terminal of the first XNOR gate 103 via the second NOT gate 102, the other input terminal of the first XNOR gate 103 is connected to the bit Add1, and an output terminal of first XNOR gate 103 outputs a response pulse corresponding to the bit Add1.

The address triggering and decision unit 200 includes a first AND gate 201. An input terminal of the first AND gate 201 is connected to an output terminal of the address transition detection unit 100, and an output terminal of the first AND gate 201 outputs a single trigger and decision signal ATDPRE.

The ATD timing generation unit 300 includes a third NOT gate 301, a first capacitor 302 and a second AND gate 303. An input terminal of the third NOT gate 301 receives the trigger and decision signal ATDPRE, an output terminal of the third NOT gate 301 is connected to both the first capacitor 302 and an input terminal of the second AND gate 303, the other input terminal of the second AND gate 303 receives the trigger and decision signal ATDPRE, and an output terminal of the second AND gate 303 outputs the address transition detection signal ATD.

The read precharge unit includes a fourth NOT gate 401, a second capacitor 402 and a third AND gate 403. An input terminal of the fourth NOT gate 401 receives the address transition detection signal ATD, an output terminal of the fourth NOT gate 401 is connected to both the second capacitor 402 and an input terminal of the third AND gate 403, the other input terminal of the third AND gate 403 receives the address transition detection signal ATD, and an output terminal of the third AND gate 403 outputs SAPC.

The sense amplification delay unit 500 includes a fifth NOT gate 501, a sixth NOT gate 502, a third capacitor 503 and a first OR gate 504. An input terminal of the fifth NOT gate 501 receives SAPC, an output terminal the fifth NOT gate 501 is connected to both the third capacitor 503 and an input terminal of the first OR gate 504 via the sixth NOT gate 502, the other input terminal of the first OR gate 504 is connected to an output terminal of the fifth NOT gate 501.

The data latch delay unit 600 includes a seventh NOT gate 601, an eighth NOT gate 602, a ninth NOT gate 604, a tenth NOT gate 605, a fourth capacitor 603 and a fourth AND gate 606. An input terminal of the seventh NOT gate 601 is connected to an output terminal of the sense amplification delay unit 500, an output terminal of the seventh NOT gate 601 is connected to both the fourth capacitor 603 and an input terminal of the ninth NOT gate 604 via the eighth NOT gate 602, an output terminal of the ninth NOT gate 604 is connected to an input terminal of the fourth AND gate 606 via the tenth NOT gate 605, the other input terminal of the fourth AND gate 606 is connected to an output terminal of the seventh NOT gate 601, and an output terminal of the fourth AND gate 606 outputs SOLAT.

The data output parallel delay unit 700 includes an eleventh NOT gate 701, a twelfth NOT gate 702, a thirteenth NOT gate 704, a second OR gate 705 and a fifth capacitor 703. An input terminal of the eleventh NOT gate 701 receives SOLAT, an output terminal of the eleventh NOT gate 701 is connected to both the fifth capacitor 703 and an input terminal of the thirteenth NOT gate 704 via the twelfth NOT gate 702, an output terminal of the thirteenth NOT gate 704 is connected to an input terminal of the second OR gate 705, the other input terminal of the second OR gate 705 receives SAPC, and an output terminal of the second OR gate 705 outputs SEN.

As shown in FIG. 4, from the input of an address Add(1:N), a single trigger and decision signal ATDPRE is generated through the address transition detection unit 100 and the address triggering and decision unit 200. From the single trigger and decision signal ATDPRE, an address transition detection signal ATD is generated by the ATD timing generation unit 300. The rising edge of the address transition detection signal ATD is triggered by the rising edge of the single trigger and decision signal ATDPRE, and the pulse width of the address transition detection signal ATD is larger than the pulse width of the single trigger and decision signal ATDPRE due to the presence of the first capacitor. From the address transition detection signal ATD, SAPC is generated by the read precharge unit 400. The rising edge of SAPC is triggered by the rising edge of the address transition detection signal ATD, and the pulse width of SAPC is lengthened to the desired duration T1 due to the presence of the second capacitor. From SAPC, SOLAT is generated through the sense amplification delay unit 500 and the data latch delay unit 600. The rising edge of SOLAT is delayed as compared with the falling edge of SAPC, as an example, the delay is T2. From SAPC and SOLAT, SEN is generated by the data output parallel delay unit 700. The rising edge of SEN is triggered by the rising edge of SAPC, and the falling edge of SEN is triggered by the falling edge of SOLAT with a delay of T4. Thus, SEN has a pulse width of T=T1+T2+T3+T4.

Figure 5:
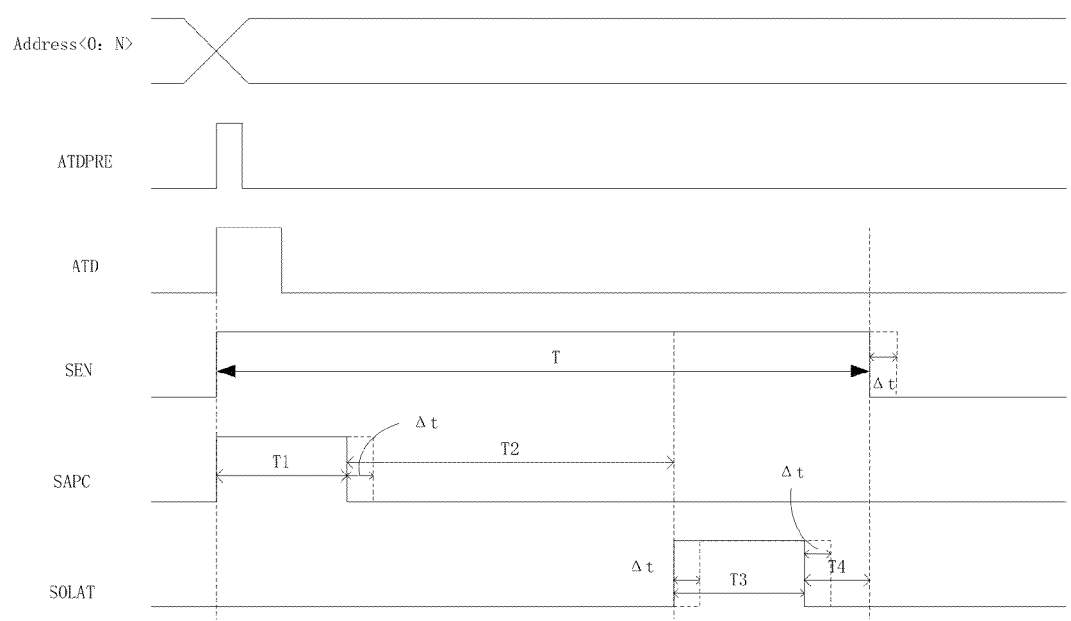
FIG. 5 illustrates waveforms at main nodes in a read timing generation circuit according to an embodiment of the present invention, with increased pulse width.

As shown in FIG. 5, when the pulse width T1 of SAPC is increased by $\Delta t$, i.e., T1'=T1+$\Delta t$, T2'=T2−$\Delta t$+$\Delta t$=T2. Similarly, the values and sequences of both T3 and T4 remain unchanged. Therefore, the read timing control signals SAPC, SEN and SOLAT generated by the read timing generation circuit according to an embodiment of the present invention are tight. If one of the control signals changes, it is ensured that the relationships in time between first-stage and following-stage signals are not affected, providing a strict correspondence between read timing signals. That is, each of the read timings can change independently without affecting the other timings.

Therefore, the read timing generation circuit according to an embodiment of the present invention generates a series of read timing signals and has low dynamic power consumption, and the generated timings are tight and of good stability.

While the foregoing illustrates and describes preferred embodiments of the present invention, it should not be taken to limit the invention as disclosed in certain preferred embodiments herein.

Variations and modifications may be made to the technical solutions of the present invention by those skilled in the art in light of the methods and technical content disclosed herein without deviation from the scope of the present invention. Therefore, any variations, equivalents, and modifications made to the embodiments herein according to the technical essential of the present invention without deviation from the scope of the present invention shall fall within the scope of protection of the present invention.

The invention claimed is:

1. A read timing generation circuit, comprising: an address transition detection unit, an address triggering and decision unit, an ATD timing generation unit and a following-stage timing generation unit, wherein
   the address transition detection unit has input terminals receiving in parallel a plurality of bits of an address, and is adapted to generate a corresponding set of response pulses;
   the address triggering and decision unit has input terminals connected in parallel to output terminals of the address transition detection unit, and is adapted to generate a single trigger and decision signal;
   the ATD timing generation unit has an input terminal receiving the trigger and decision signal, and is adapted to generate an address transition detection signal;
   the following-stage timing generation unit has an input terminal receiving the address transition detection signal, and is adapted to generate subsequent control signals,
   the address transition detection unit comprises a plurality of address transition detection branches, each of which comprises a first NOT gate, a second NOT gate and a first XNOR gate; and
   in each of the address transition detection branches, an input terminal of the first NOT gate receives one of the plurality of bits of the address, an output terminal of the first NOT gate is connected to an input terminal of the first XNOR gate via the second NOT gate; the other input terminal of the first XNOR gate is connected to the bit of the address; and an output terminal of the first XNOR gate outputs a response pulse corresponding to the bit of the address.

2. The read timing generation circuit according to claim 1, wherein, the following-stage timing generation unit comprises: a read precharge unit, a sense amplification delay unit, a data latch delay unit and a data output parallel delay unit; the subsequent control signals comprise: Sense Amplification Precharge Control (SAPC), Sense Out LATch (SOLAT) and Sense Enable (SEN); and
   the read precharge unit has an input terminal receiving the address transition detection signal, and is adapted to generate SAPC;
   the sense amplification delay unit has an input terminal receiving SAPC and an output terminal connected to an input terminal of the data latch delay unit;
   the data latch delay unit is adapted to generate SOLAT; and
   the data output parallel delay unit has an input terminal receiving SOLAT and another input terminal receiving SAPC, and is adapted to generate SEN.

3. The read timing generation circuit according to claim 1, wherein, the address triggering and decision unit comprises a first AND gate; and an input terminal of the first AND gate is connected to an output terminal of the address transition detection unit, and an output terminal of the first AND gate outputs the single trigger and decision signal.

4. The read timing generation circuit according to claim 1, wherein, the ATD timing generation unit comprises a third NOT gate, a first capacitor and a second AND gate; and
   an input terminal of the third NOT gate receives the trigger and decision signal, an output terminal of the third NOT gate is connected to both the first capacitor and an input terminal of the second AND gate, the other input terminal of the second AND gate receives the trigger and decision signal, and an output terminal of the second AND gate outputs the address transition detection signal.

5. The read timing generation circuit according to claim 2, wherein, the read precharge unit comprises a fourth NOT gate, a second capacitor and a third AND gate; and
   an input terminal of the fourth NOT gate receives the address transition detection signal, an output terminal of the fourth NOT gate is connected to both the second capacitor and an input terminal of the third AND gate, the other input terminal of the third AND gate receives the address transition detection signal, and an output terminal of the third AND gate outputs SAPC.

6. The read timing generation circuit according to claim 2, wherein, the sense amplification delay unit comprises a fifth NOT gate, a sixth NOT gate, a third capacitor and a first OR gate; and
   an input terminal of the fifth NOT gate receives SAPC, an output terminal the fifth NOT gate is connected to both the third capacitor and an input terminal of the first OR gate via the sixth NOT gate, and the other input terminal of the first OR gate is connected to an output terminal of the fifth NOT gate.

7. The read timing generation circuit according to claim 2, wherein, the data latch delay unit comprises a seventh NOT gate, an eighth NOT gate, a ninth NOT gate, a tenth NOT gate, a fourth capacitor and a fourth AND gate; and
   an input terminal of the seventh NOT gate is connected to an output terminal of the sense amplification delay unit, an output terminal of the seventh NOT gate is connected to both the fourth capacitor and an input terminal of the ninth NOT gate via the eighth NOT gate, an output terminal of the ninth NOT gate is connected to an input terminal of the fourth AND gate via the tenth NOT gate, the other input terminal of the fourth AND gate is connected to an output terminal of the seventh NOT gate, and an output terminal of the fourth AND gate outputs SOLAT.

8. The read timing generation circuit according to claim 2, wherein, the data output parallel delay unit comprises an eleventh NOT gate, a twelfth NOT gate, a thirteenth NOT gate, a second OR gate and a fifth capacitor; and
   an input terminal of the eleventh NOT gate receives SOLAT, an output terminal of the eleventh NOT gate is connected to both the fifth capacitor and the thirteenth NOT gate via the twelfth NOT gate, an output terminal of the thirteenth NOT gate is connected to an input terminal of the second OR gate, the other input terminal of the second OR gate receives SAPC, and an output terminal of the second OR gate outputs SEN.

* * * * *